(12) United States Patent
Mathuria et al.

(10) Patent No.: US 9,875,776 B1
(45) Date of Patent: Jan. 23, 2018

(54) BIT WRITABILITY IMPLEMENTATION FOR MEMORIES

(71) Applicant: QUALCOMM Incorporated, San Diego, CA (US)

(72) Inventors: Priyankar Mathuria, Bangalore (IN); Rakesh Kumar Sinha, Bangalore (IN); Sharad Kumar Gupta, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/363,401

(22) Filed: Nov. 29, 2016

(51) Int. Cl.
*G11C 7/00* (2006.01)
*G11C 7/12* (2006.01)
*G11C 7/10* (2006.01)

(52) U.S. Cl.
CPC .............. *G11C 7/12* (2013.01); *G11C 7/1012* (2013.01); *G11C 7/1051* (2013.01)

(58) Field of Classification Search
CPC ........ G11C 7/12; G11C 7/1012; G11C 7/1051
USPC .................................................. 365/189.02
See application file for complete search history.

(56) References Cited

U.S. PATENT DOCUMENTS

| | | | | |
|---|---|---|---|---|
| 5,504,710 A | * | 4/1996 | Somon | G11C 7/1006 365/189.05 |
| 6,664,822 B2 | * | 12/2003 | Watabe | H02M 7/538 327/108 |
| 7,521,982 B2 | | 4/2009 | Shimizu | |
| 8,823,424 B1 | | 9/2014 | Tseng et al. | |
| 9,105,353 B2 | | 8/2015 | Nishijima | |
| 9,299,418 B2 | | 3/2016 | Nii et al. | |
| 2002/0152352 A1 | * | 10/2002 | Ikegai | G06F 17/30982 711/108 |
| 2014/0119099 A1 | | 5/2014 | Clark et al. | |

\* cited by examiner

*Primary Examiner* — Pho M Luu
(74) *Attorney, Agent, or Firm* — Arent Fox, LLP and Qualcomm, Incorporated

(57) ABSTRACT

Maskable level shifter circuits and memories are provided. Memories may include a plurality of memory cells and a bitline coupled to the plurality of memory cells. The memories includes a maskable level shifter configured to receive write data and a mask signal. A maskable level shifter includes a level shifter configured to level shift the write data and output the level shifted write data to the bitline when the mask signal is inactive and a masking circuit configured to remove power from the level shifter when the mask signal is active. Another maskable level shifter includes a level shifter configured to level shift the write data and output the level shifted write data to the bitline when the mask signal is inactive and a masking circuit configured to output a predetermined state to the bitline when the mask signal is active.

21 Claims, 6 Drawing Sheets

BIT WRITABILITY IMPLEMENTATION FOR MEMORIES

BACKGROUND

Field

The present disclosure relates generally to memory systems, and more particularly, to a maskable level shifter or maskable level shifter circuit that may be used in a memory system.

Background

Some example memory systems may use paged based memory addressing. Systems using page based memory addressing may use fixed-length blocks or "pages" of memory. The fixed length blocks (a.k.a. pages) may be assigned to fixed regions of physical memory called "page frames." A memory using page based memory addressing may be addressed by the page using a page address. Memory locations within the page of memory may be addressed using an offset or displacement within a page. Accordingly, a logical address may include a page address and a displacement.

Some existing Physical Page Address (PPA) designs for bit writable logic may use two separate level shifters and two separate latches for data input and enable signals, as well as a NOR gate for masking the data input. Accordingly, existing PPA designs may require more die area and may consume more power. Additionally, the NOR gate may impart an additional gate delay in the write path of a memory using such a PPA design.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

As discussed above, existing PPA designs may require more die area and may consume more power. Additionally, the NOR gate may impart an additional gate delay in the write path of a memory using such a PPA design. The PPA design may have a clock to word delay of five logic stages. Some example designs described herein may use less area, use less power, have lower gate delay, have fewer logic stages, or some combination of these.

In an aspect of the disclosure, an apparatus is provided. The apparatus may be a maskable level shifter circuit. The maskable level shifter circuit may include a level shifter having an output. Additionally, the level shifter may be configured to receive a mask signal. The maskable level shifter circuit may include a masking circuit. The masking circuit may be configured to remove power from the level shifter when the mask signal is active and pull the output to a predetermined state when the power is removed.

In an aspect of the disclosure, an apparatus is provided. The apparatus may be a memory. The memory may include a plurality of memory cells. Additionally, the memory may include a bitline coupled to the plurality of memory cells. The memory may also include a maskable level shifter. The maskable level shifter may be configured to receive write data and a mask signal. Additionally, the maskable level shifter may include a level shifter. The level shifter may be configured to level shift the write data and output the level shifted write data to the bitline when the mask signal is inactive. Additionally, the maskable level shifter may include a masking circuit configured to remove power from the level shifter when the mask signal is active.

In an aspect of the disclosure, an apparatus is provided. The apparatus may be a memory. The memory may include a plurality of memory cells. The memory may also include a bitline coupled to the plurality of memory cells. Additionally, the memory may also include a maskable level shifter. The maskable level shifter may be configured to receive write data and a mask signal. The maskable level shifter has a level shifter and may be configured to level shift the write data and output the level shifted write data to the bitline when the mask signal is inactive. The maskable level shifter may also include a masking circuit configured to output a predetermined state to the bitline when the mask signal is active.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
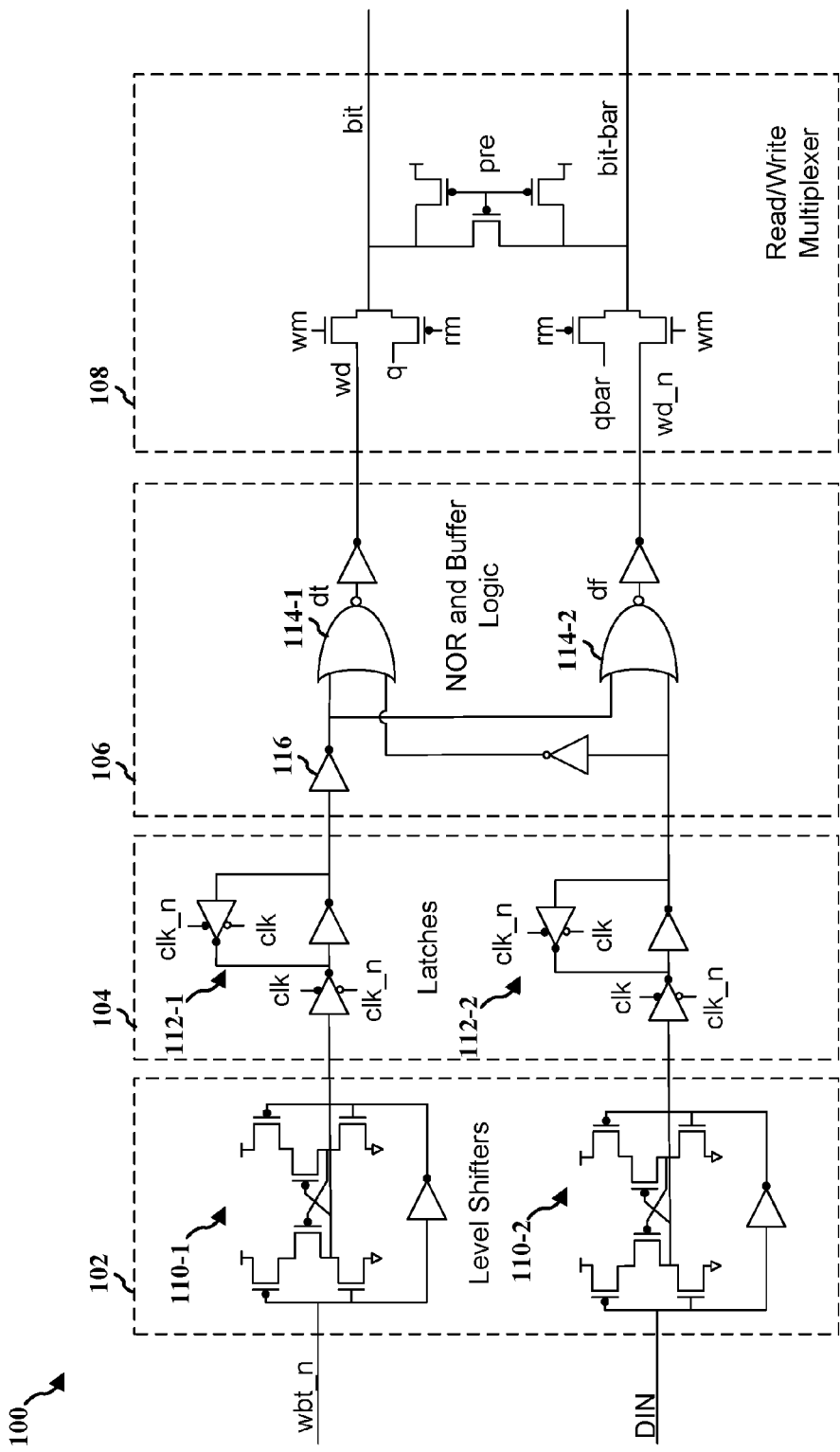
FIG. 1 is a diagram illustrating an example PPA design for bit writable logic.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example PPA 100. The example PPA 100 includes a set of level shifters 102, latches 104, NOR and buffer logic 106, and a read/write buffer 108. The PPA 100 example of FIG. 1 is a design for bit writable logic, e.g., a memory that may store a bit. As discussed above, some PPA designs for bit writable logic may use two separate level shifters, e.g., in the set of level shifters 102. For example, the PPA 100 includes two level shifters 110. Additionally, some PPA designs for bit writable logic may use two latches for data input (din) and enable signals (wbt_n). For example, the PPA 100 includes two latches 112, one latch for a data input (din) signal and one latch for an enable signal (wbt_n). Additionally, some PPA designs for bit writable logic may use two NOR gates for masking the data input. For example, the PPA 100 includes two NOR gates (the NOR gates within the NOR and buffer logic 106) for masking the data input, e.g., based on the enable signal (wbt_n).

Because existing PPA designs may have two level shifters, the existing PPA designs may require more area and more power than the PPA designs described herein according to various aspects of the disclosure. For example, the PPA designs may have two level shifters, the PPA 100 may require more area and more power than the designs described herein. Furthermore, the NOR logic (within the NOR and buffer logic 106) provides additional gate delay in the write path. Additionally, the clock to wd/wd_n has five stages, e.g., five levels of gate delays.

The function of the PPA 100 is summarized in TABLE 1 below.

TABLE 1

Truth Table

| wbt_n | din | Function |
|-------|-----|----------|
| 0 | 0 | Write0 |
| 0 | 1 | Write1 |
| 1 | X | Mask (no write) |

TABLE 1 is a truth table that describes the function of the PPA 100 of FIG. 1. For inputs of wbt_n and DIN (write data) both equal to a logic "0," a Write0 function is selected. For example, the logic 0 on wbt_n may be level shifted and inverted by one of the level shifters 110-1 within the set of level shifters 102 and latched by one of the latches 112-1 within the latches 104. The logic 0 on DIN may also be level shifted and inverted by one of the level shifters 110-2 within the set of level shifters 102 and latched by one of the latches 112-2 within the latches 104. Accordingly, the output dt of one of the NOR gates 114-1 may be a logic 1 which leads the output of bit being a logic 0. Similarly, the output df of one of the NOR gates 114-2 may be a logic 0 and bit-bar may be a logic 1. With bit a logic 0 and bit-bar a logic 1, a write 0 may occur.

For inputs of wbt_n equal to a logic 0 and DIN equal to a logic 1, a Write1 function is selected. For example, the logic 0 on wbt_n may be level shifted and inverted by one of the level shifters 110-1 within the set of level shifters 102 and latched by one of the latches 112-1 within the latches 104. The logic 1 on DIN may also be level shifted and inverted by one of the level shifters 110-2 within the set of level shifters 102 and latched by one of the latches 112-2 within the latches 104. Accordingly, the output dt of one of the NOR gates 114-1 may be a logic 0 and bit may be 1. The output df of one of the NOR gates 114-2 may be a logic 0 and bit-bar may be a logic 0. With bit a logic 1 and bit-bar a logic 0, a write 1 may occur.

For inputs of wbt_n equal to a logic 1 and DIN equal to a logic X, i.e., "don't care," DIN may be a logic 0 or a logic 1, a mask function is selected. For example, the logic 1 on wbt_n may be level shifted and inverted by one of the level shifters 110-1 within the set of level shifters 102 and the inverted signal, at a logic 0, may be latched by one of the latches 112-1 within the latches 104. The logic 0 may be inverted by the inverter 116 to generate a logic 1 that is an input to both NOR gates 114. Accordingly, regardless of the state of din, the outputs bit and bit-bar will both be logic 1 values because the logic 1 on wbt_n will lead to at least one logic 1 on both NOR gates 114.

Figure 2:
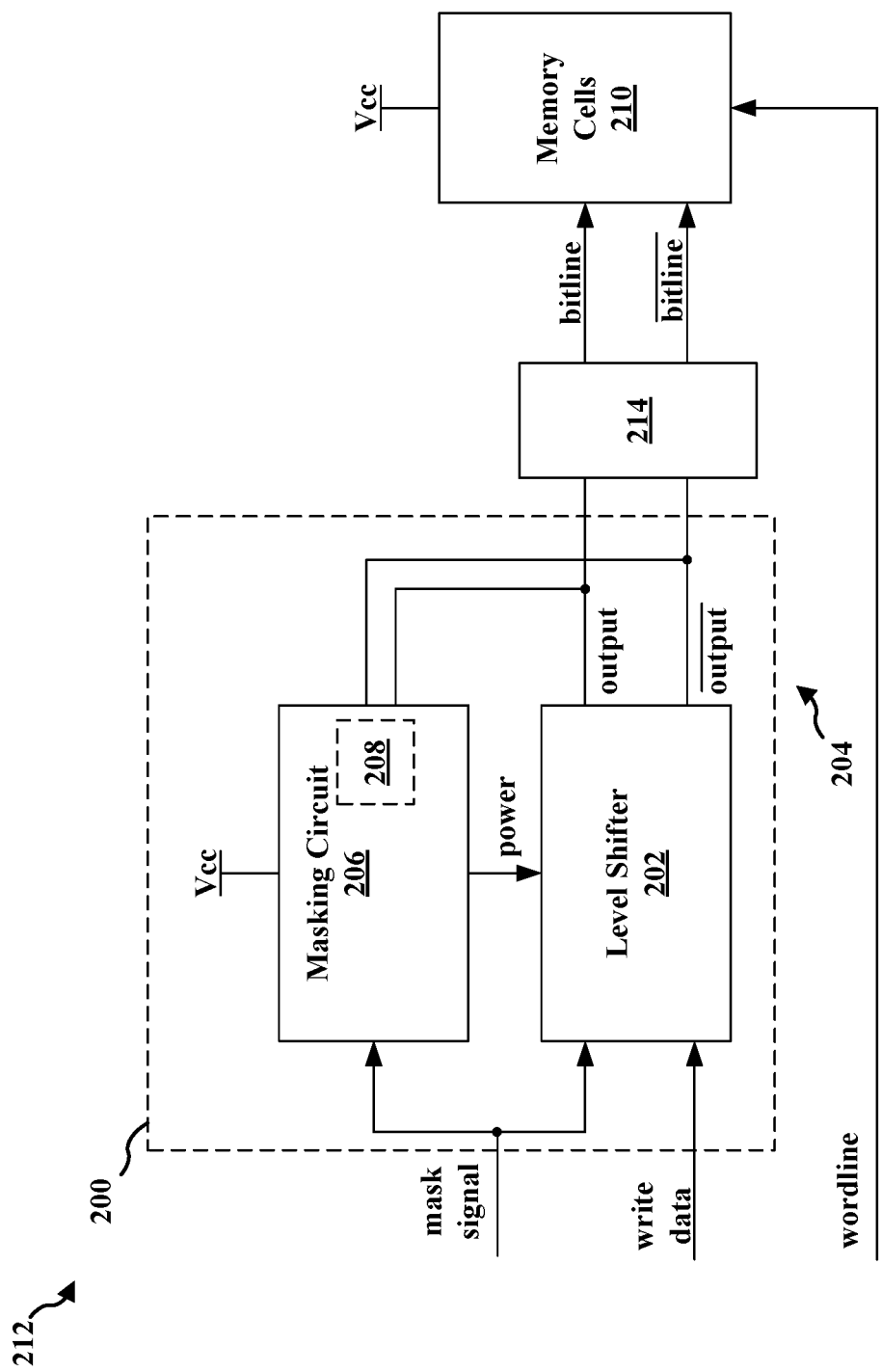
FIG. 2 is a diagram illustrating an example maskable level shifter.

FIG. 2 is a diagram illustrating an example maskable level shifter circuit 200. The maskable level shifter circuit 200 includes a level shifter 202 having an output. The level shifter 202 output may include complimentary outputs 204. Additionally, the level shifter 202 may be configured to receive a mask signal.

The maskable level shifter circuit 200 includes a masking circuit 206. The masking circuit 206 is configured to remove power from the level shifter, e.g., disconnect Vcc from the level shifter, when the mask signal is active and pull the level shifter output to a predetermined state, e.g., a logic 1 or a logic 0, when the power is removed. Additionally, the masking circuit 206 may be further configured to drive both of the complimentary outputs to the same predetermined state when the power is removed from the level shifter. For example, the masking circuit 206 may include a pulldown circuit 208 configured to drive the each of the complimentary outputs to ground when the power is removed from the level shifter 202.

In an example, the maskable level shifter circuit 200, e.g., the masking circuit 206, may include a head switch configured to remove the power from the level shifter 202 when the mask signal is active. In the example, the maskable level shifter circuit 200, e.g., the masking circuit 206, may further include a head switch controller configured to control the head switch. The head switch controller may be responsive to the level shifter output.

Another example is a memory 212 that includes the maskable level shifter circuit 200. The memory 212 includes a plurality of memory cells 210 and a bitline coupled to the plurality of memory cells 210. The maskable level shifter is configured to receive write data and a mask signal. The maskable level shifter circuit 200 includes a level shifter 202 configured to level shift the write data and output the level shifted write data to the bitline when the mask signal is inactive. The maskable level shifter circuit 200 includes a masking circuit configured to remove power from the level shifter when the mask signal is active. In another example, the masking circuit 206 is configured to output a predetermined state to the bitline when the mask signal is active. The maskable level shifter circuit 200 also includes latches and read/write multiplexer circuitry 214. Details of the latches and read/write multiplexer circuitry 214 are illustrated in FIG. 3.

Figure 3:
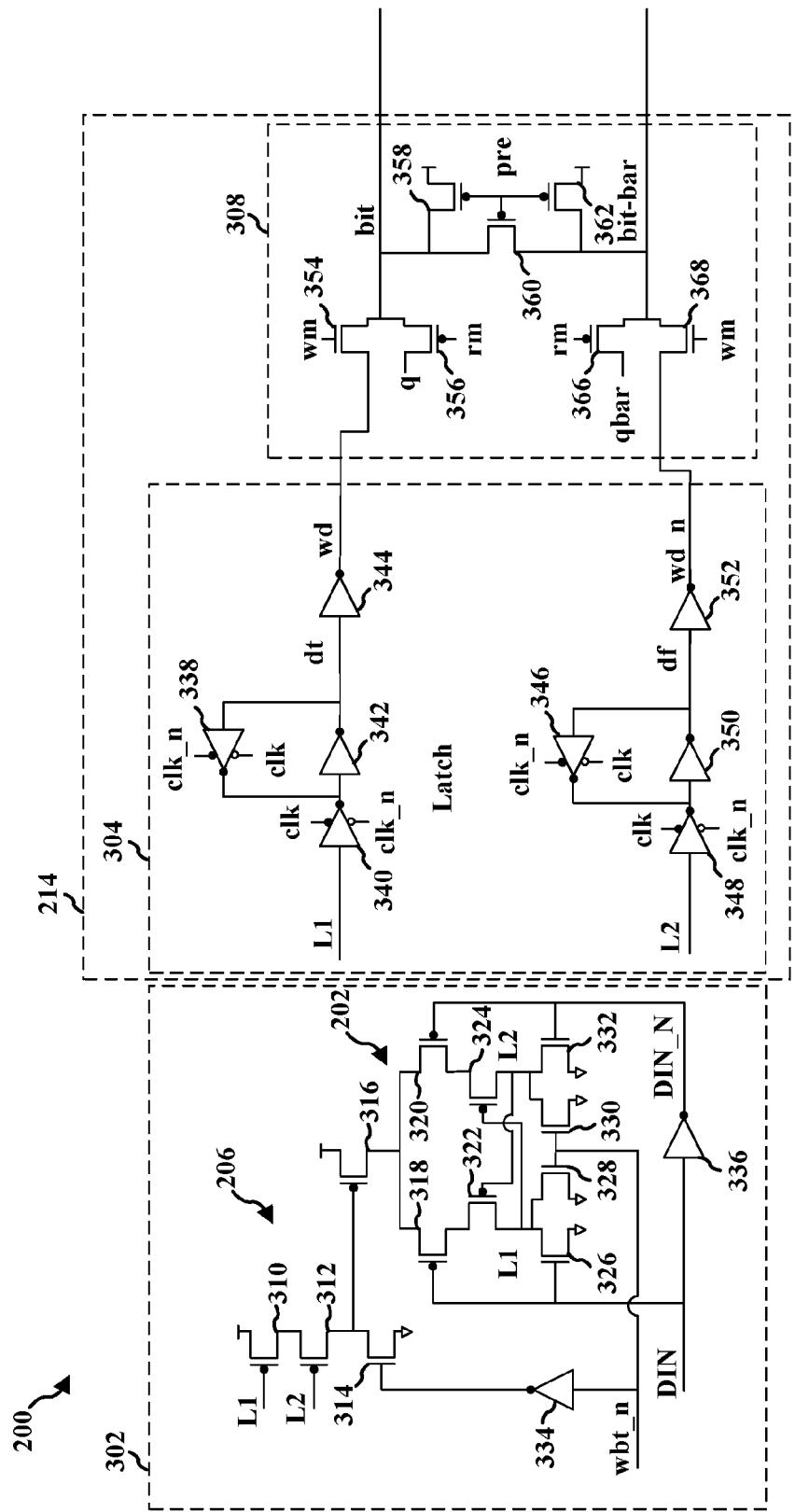
FIG. 3 is a diagram illustrating an example maskable level shifter circuit.

FIG. 3 is a diagram illustrating an example maskable level shifter circuit 200. The example maskable level shifter circuit 200 includes level shifting and masking circuit 302. The level shifting and masking circuit 302 includes masking circuit 206 and a single level shifter 202. The maskable level shifter circuit 200 also includes latches and read/write multiplexer circuitry 214. The latches and read/write multiplexer circuitry 214 includes latches 304, and a read/write multiplexer 308. The masking circuit 206 includes p-type metal oxide semiconductor (PMOS) transistors 310, 312 and n-type metal oxide semiconductor (NMOS) transistor 314. The level shifter 202 includes PMOS transistors 316, 318, 320, 322, 324 and NMOS transistors 326, 328, 330, 332. The level shifting and masking circuit 302 also includes inverters 334, 336. The latches 304 include inverters 338, 340, 342, 344, 346, 348, 350, 352. The inverters 338, 340, 346, 348 include enable circuitry. The read/write multiplexer 308 includes PMOS transistors 356, 358, 360, 362, 366 and NMOS transistors 354, 368.

The maskable level shifter circuit 200 of FIG. 3 may be used with bit writable logic for memory. For example, the maskable level shifter circuit 200 may be used to level shift signals used to write to the bit writable logic. The example maskable level shifter circuit 200 has a single level shifter 202 which may lead to reduced power consumption. Additionally, the NOR logic is removed from the maskable level shifter circuit 200 which may lead to faster write operation (and may also reduce power consumption).

The maskable level shifter circuit 200 has a CLK to wd/wd_n delay of three stages, rather than five stages. In the maskable level shifter circuit 200, the level shifting and masking circuit 206 maybe configured to receive a mask signal (wbt_n). The mask signal may control the masking function of the example maskable level shifter circuit 200. For example, the maskable level shifter circuit 200 includes a masking circuit 206. The masking circuit 206 is configured to remove power from the level shifter 202 when the mask signal (wbt_n) is active and drive the level shifter output to a predetermined state when the power is removed.

As described above, the example maskable level shifter circuit 200 includes a level shifter 202 and a masking circuit 206. As illustrated in FIG. 3, the level shifter 202 has an output (L1/L2). The level shifter 202 output (L1/L2) may include complimentary outputs L1, L2. Additionally, the level shifter 202 may be configured to receive a mask signal (wbt_n). The mask signal (wbt_n) may control the level shifter 202.

The maskable level shifter circuit 200 includes a masking circuit 206. The masking circuit 206 is configured to remove power from the level shifter 202 when the mask signal (wbt_n) is active and pull the level shifter output (bit/bit-bar) to a predetermined state when the power is removed. Additionally, the masking circuit 206 may be further configured to drive each of the complimentary outputs (bit/bit-bar) to the predetermined state when the power is removed from the level shifter. For example, the masking circuit 206 may include a pulldown circuit 208 configured to drive each of the complimentary outputs (bit/bit-bar) to ground when the power is removed from the level shifter 202.

In an example, the maskable level shifter circuit 200, e.g., the masking circuit 206, may include a head switch configured to remove the power from the level shifter 202 when the mask signal is active. In the example, the maskable level shifter circuit 200, e.g., the masking circuit 206, may further include a head switch controller configured to control the head switch. The head switch controller may be responsive to the level shifter output (bit/bit-bar).

Another example is a memory 212. The memory 212 includes a plurality of memory cells 210 and a bitline coupled to the plurality of memory cells 210. The memory 212 also includes a maskable level shifter circuit 200. The maskable level shifter circuit 200 is configured to receive write data and a mask signal. The maskable level shifter circuit 200 includes a level shifter 202 configured to level shift the write data and output the level shifted write data to the bitline when the mask signal is inactive. The maskable level shifter circuit 200 includes a masking circuit 206 configured to remove power from the level shifter 202 when the mask signal is active. In another example, the masking circuit 206 is configured to output a predetermined state to the bitline when the mask signal is active.

As discussed above, the latches 304 include inverters 338, 340, 342, 344, 346, 348, 350, 352. The inverters 338, 340, 346, 348 include enable circuitry. The signal L1 may be inverted by the inverter 340 when the inverter 340 is enabled by the clock signals (clk, clk_n). The logic value on the output of the inverter 340 is fed back through the inverter 342 and the inverter 338. The inverter 338 is enabled when the inverter 340 is disabled and disabled when the inverter 340 is enabled. Accordingly, the latch connected to the signal L1 may hold a value. The inverter may invert the value being held so that the polarity of the output of the latch on L1 matches the polarity of L1 when the inverter 340 was last enabled.

Similarly, the signal L2 may be inverted by the inverter 348 when the inverter 348 is enabled by the clock signals (clk, clk_n). The logic value on the output of the inverter 348 is fed back through the inverter 350 and the inverter 346. The inverter 346 is enabled when the inverter 348 is disabled and disabled when the inverter 348 is enabled. Accordingly, the latch connected to the signal L2 may hold a value. The inverter may invert the value being held so that the polarity of the output of the latch on L2 matches the polarity of L2 when the inverter 348 was last enabled.

The read/write multiplexer include PMOS transistors 356, 358, 360, 362, 366 and NMOS transistors 354, 368. For a write to memory the wm signal may be active, e.g., a logic 1. Accordingly, the NMOS transistors 354, 368, may be on. Accordingly, signals may be passed through the NMOS transistors 354, 368 to memory cells 210. When a write is not occurring the NMOS transistors 354, 368 may be off. When a read occurs, the signal rm may be active. The signal rm may be active low in some examples. When a read occurs the signals q and qbar may be coupled to a memory cell so that the contents of the memory cell, e.g., as complimentary outputs, may be driven onto q and qbar respectively.

Figure 4:
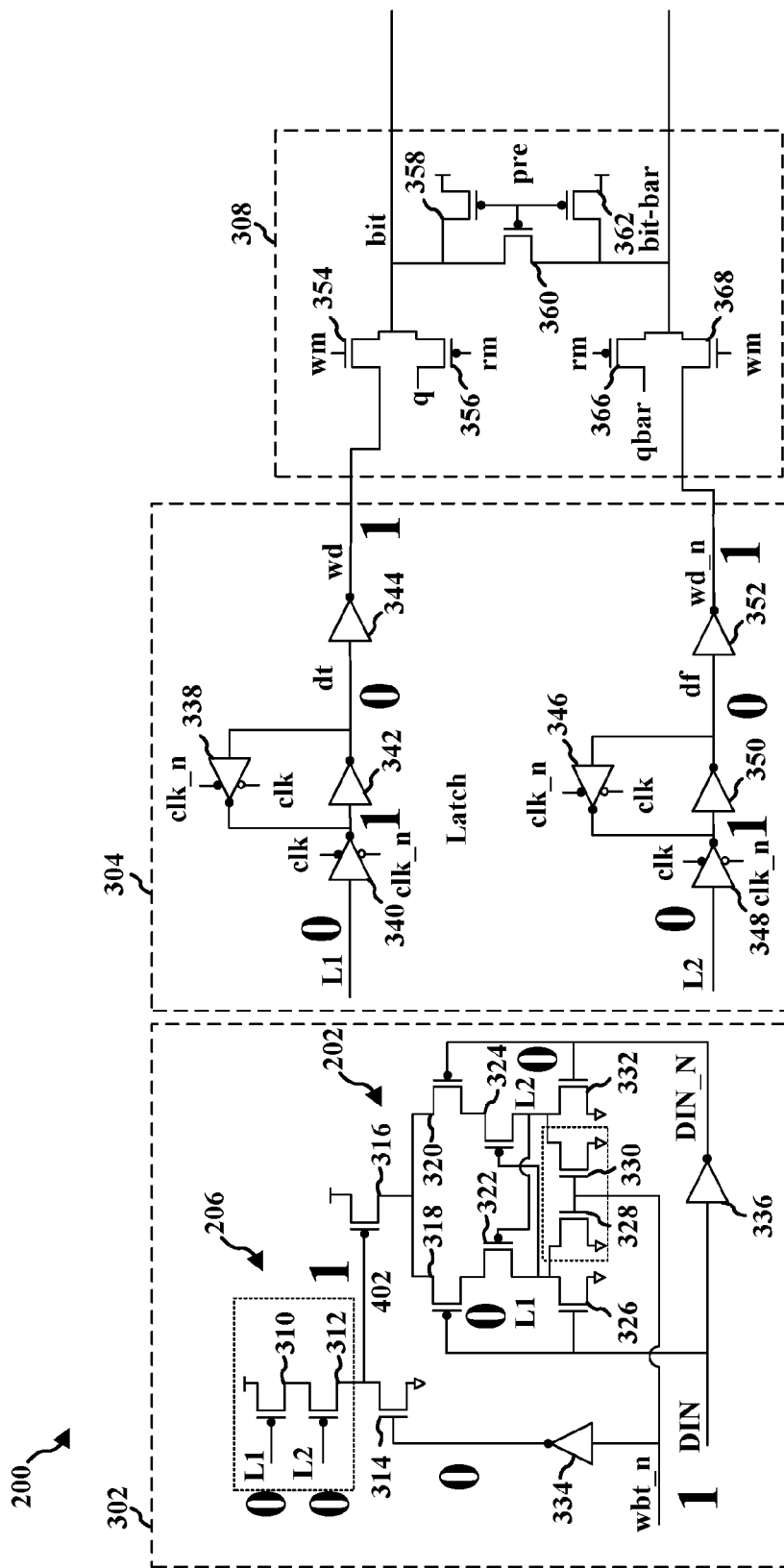
FIG. 4 is a diagram illustrating the example maskable level shifter circuit of FIG. 3 with the mask bit equal to a logic "1"

FIG. 4 is a diagram illustrating the example maskable level shifter circuit 200 of FIG. 3 with the mask bit (wbt_n) equal to a logic 1. With the mask bit (wbt_n) equal to a logic "1," the masking circuit 206 removes power from the level shifter 202, e.g., when the mask signal is active, and drives the level shifter 202 output to a predetermined state when the power is removed.

For example, with the mask bit (wbt_n) equal to a logic 1, the NMOS transistors 328, 330 may be on (as long as power remains) and L1 and L2 will both be pulled low through the transistors 328, 330. With L1 and L2 both low, the PMOS transistors 310, 312 will be on. Additionally, the NMOS transistor will be off because the output of the inverter 334 is low. With the PMOS transistors 310, 312 on, the signal 402 will be a logic 1 because the signal 402 will be pulled high through the PMOS transistors 310, 312. With the signal 402 high, the PMOS transistor 316 will be off, which removes power from the level shifter 202. With L1 and L2 both logic 0, the wd and wd_n signals will both be logic 1 and the outputs bit and bit-bar will both be logic 1 values. Accordingly, the circuit of FIGS. 3-4, removes power from the level shifter 202 when the mask signal is active and pull the level shifter 202 output to a predetermined state, e.g., logic 1, when the power is remove.

Figure 5:
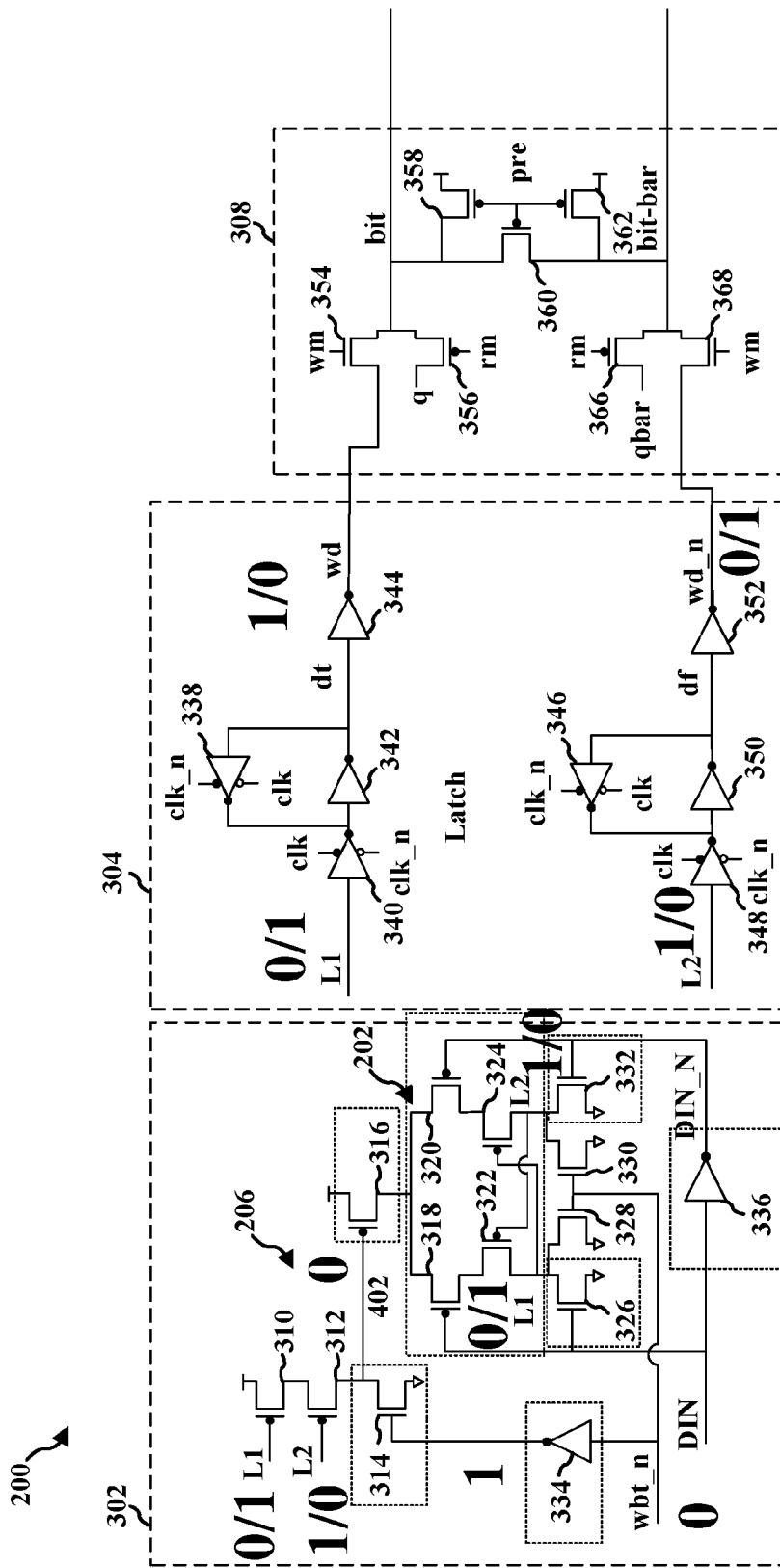
FIG. 5 is a diagram illustrating the example maskable level shifter circuit of FIG. 3 with the mask bit equal to a logic "0."

FIG. 5 is a diagram illustrating the example maskable level shifter circuit 200 of FIG. 3 with the mask bit (wbt_n) equal to a logic 0. With the mask bit (wbt_n) equal to a logic 0, the masking circuit 206 provides power to the level shifter 202, e.g., when the mask signal is not active, and does not drive the level shifter 202 output to a predetermined state. Accordingly, when the mask bit (wbt_n) is a logic 1 the circuit of FIG. 5 allows the data in (DIN) to pass into the rest of the circuit.

For example, with wbt_n a logic 1, the NMOS transistor 314 is on. With the NMOS transistor 314 on, power may be provided to the level shifter 202. Accordingly, L1 and L2 may depend on the input, DIN which provides the write data, e.g., to be written to memory. When DIN is a logic 0, the PMOS transistor 318 will be on and L1 will be pulled high through the PMOS transistor 318. When DIN is a logic 0, the NMOS transistor 332 will be on and L2 will be pulled low through the NMOS transistor 332. Conversely, when DIN is a logic 1, the NMOS transistor 326 will be on and L1 will be pulled low through the NMOS transistor 326. When DIN is a logic 1, the PMOS transistor 324 will be on and L2 will be pulled high through the PMOS transistor 324. Accordingly, the NMOS transistors 326, 332 may form the pull down circuit 208.

That is, L1 and L2 are the inverse of each other. Additionally, L1 and L2 will be latched by the latches 304 and may be output by the read/write multiplexer 308. When the bit and bit-bar signals are driven by the read/write multiplexer 308, the data (on bit and bit-bar) may be written to a memory, such as the memory cells 210 of FIG. 2.

Accordingly, as described above, the masking circuit 206 provides power to the level shifter 202, e.g., when the mask signal is not active, and does not drive the level shifter 202 output to a predetermined state. When the mask bit is a logic "0" the masking circuit 206 allows the data in (DIN) to pass into the rest of the circuit.

Figure 6:
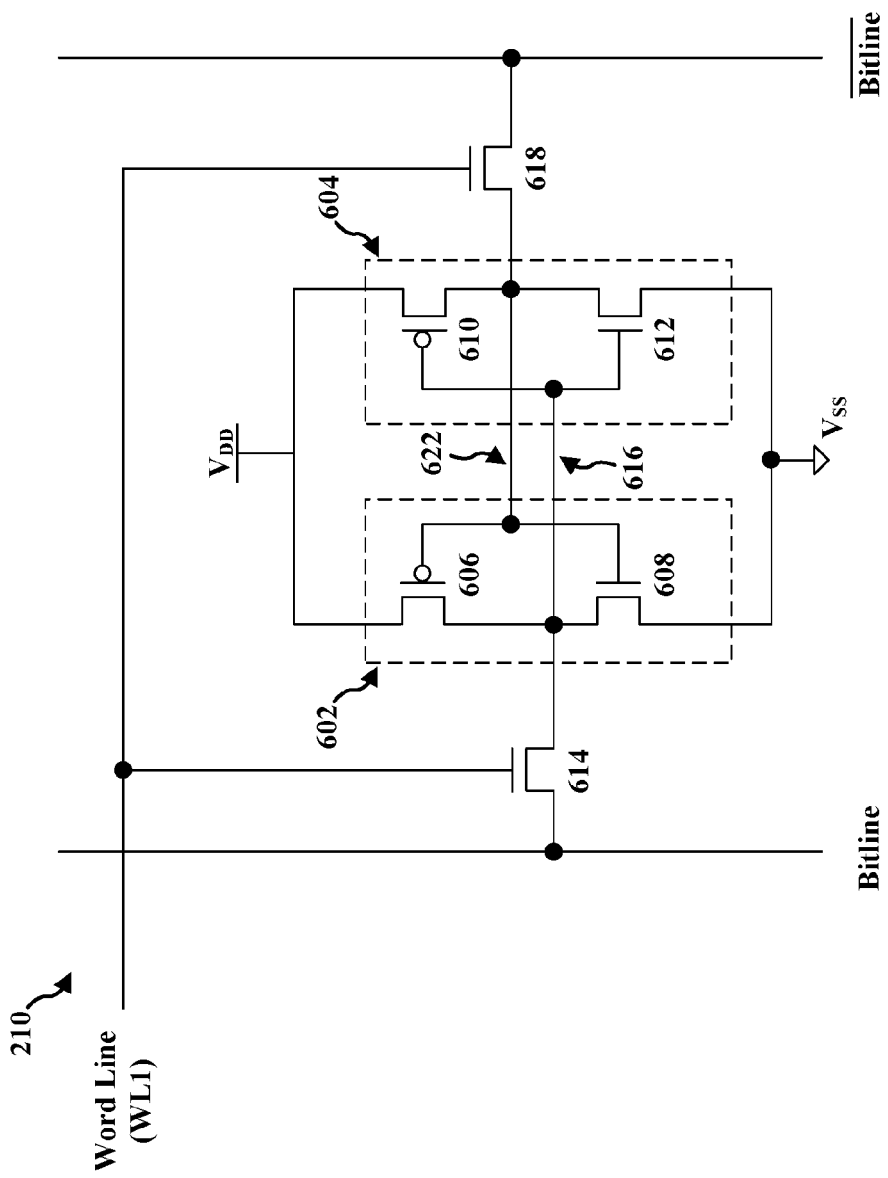
FIG. 6 is a schematic diagram of an exemplary memory cell of FIG. 2.

FIG. 6 is a schematic diagram of an exemplary embodiment of the memory cell 210 of FIG. 2. The memory cell 210 illustrated in FIG. 6 is a six-transistor (6T) configuration. However, as those skilled in the art will readily appreciate, the memory cell 210 may be implemented with a four-transistor (4T) configuration, an eight transistor (8T) configuration, a ten transistor (10T) configuration, or any other suitable transistor configuration that may be used to implement a memory cell.

The memory cell 210 is shown with two inverters 602, 604. The first inverter 202 includes a PMOS transistor 606 and an NMOS transistor 608. The second inverter 604 comprises a PMOS transistor 610 and an NMOS transistor 612. In the described embodiment, the inverters 602 and 604 are powered by VDD and have a return VSS (e.g., ground). The first inverter 602 and the second inverter 604 are interconnected to form a cross-coupled latch. A first NMOS access transistor 614 couples the output node 616 from the second inverter 604 to a bitline BL-a, and a second NMOS access transistor 618 couples the output node 620 from the first inverter 602 to a bitline BL-b (the value of which is the opposite or inverse of the bitline BL-a). The gates of the NMOS access transistors 614, 618 are coupled to a wordline WL.

A write operation may be performed by setting the bitlines BL-a and BL-b to the value to be written to the memory cell 210 and asserting the wordline WL. The wordline WL may be asserted before the value to be written is provided to the bitlines BL-a and BL-b, e.g., provided by the level shifter 202. By way of example, a low value, e.g., a logic level "1" may be written to the memory cell 210 by setting the bitline BL-a to a logic level 0 and the bitline BL-b to a logic level 1. The logic level 0 at the bitline BL-a is applied to the inerter 604 through the NMOS access transistor 614, which in turn forces the output node 620 of the second inverter 604 to VDD. The output node 620 of the second inverter 604 is applied to the input of the first inverter 602, which in turn forces the output node 616 of the first inverter 602 to VSS. A logic level 0 may be written to the memory cell 210 by inverting the values of the bitlines BL-a and BL-b. The write driver, e.g., from the level shifter 202, may be designed to be stronger than PMOS pull-up transistors (606 and 610) in the memory cell 210 so that the write driver can override the previous state of the cross-coupled inverters 602, 604.

Once the write operation is complete, the wordline is de-asserted, thereby causing the NMOS access transistors 614 and 618 to disconnect the bitlines BL-a and BL-b from the two inverters 602, 604. The cross-coupling between the two inverters 602, 604 maintains the state of the inverter outputs as long as power is applied to the memory cell 210.

The memory cell 210 stores data according to the data values stored at nodes 616 and 620. If the memory cell 210 stores a logic high (e.g., a '1'), then output node 616 is at a logic high and output node 620 is at a logic low (e.g., a '0'). If the memory cell 210 stores a logic low, then output node 616 is at a logic low and output node 620 is at logic high. During a read operation, differential bit lines BL-1a and BL-1b may be pre-charged by a pre-charge circuit. The word line WL is then asserted, thereby turning on NMOS access transistors 614, 618. The timing between the pre-charging and asserting the wordline WL may be controlled by a row decoder (not illustrated).

If memory cell 210 stores a logic high, then bit line BL-1a remains charged via NMOS access transistor 614, and complimentary bit line BL-1b is discharged via NMOS transistor 618. If memory cell 210 stores a logic low, then bit line BL-1a is discharged via NMOS access transistor 614, and complimentary bit line BL-1b remains charged via NMOS access transistor 618.

One example apparatus described herein is a maskable level shifter circuit 200. The maskable level shifter circuit 200 includes a level shifter 202 having an output. The level shifter 202 is configured to receive a mask signal (mask signal, wbt_n). The maskable level shifter circuit 200 also includes a masking circuit 206 configured to remove power from the level shifter 202 when the mask signal (mask signal, wbt_n) is active (e.g., active low) and pull the level shifter 202 output to a predetermined state (e.g., logic 1 or logic 0) when the power is removed from the level shifter 202.

In an aspect, the masking circuit 206 further includes a pulldown circuit 208 configured to drive the each of the complimentary outputs to ground when the power is removed from the level shifter 202.

An aspect further includes a head switch (PMOS transistor 316) configured to remove the power from the level shifter 202 when the mask signal (mask signal, wbt_n) is active.

An aspect further includes a head switch controller (e.g., PMOS transistors 310, 312 and NMOS transistor 314) configured to control the head switch (PMOS transistor 316). The head switch controller (e.g., PMOS transistors 310, 312 and NMOS transistor 314) may be responsive to the level shifter output (e.g., L1/L2).

One example apparatus described herein is a memory 212. The memory 212 includes a plurality of memory cells 210. The memory 212 also includes a bitline coupled to the plurality of memory cells 210. Additionally, the memory 212 also includes a maskable level shifter circuit 200 configured to receive write data (write data, DIN) and a mask signal (mask signal, wbt_n). The maskable level shifter circuit 200 includes a level shifter 202 configured to level shift the write data (write data, DIN) and output the level shifted write data to the bitline when the mask signal (mask signal, wbt_n) is inactive. The maskable level shifter circuit 200 also includes a masking circuit 206 configured to remove power from the level shifter 202 when the mask signal (mask signal, wbt_n) is active.

In an aspect, the level shifter 202 output includes complimentary outputs. The masking circuit 206 may be further configured to drive each of the complimentary outputs to the predetermined state when the power is removed from the level shifter.

In an aspect, the masking circuit 206 further includes a pulldown circuit 208 configured to drive the each of the complimentary outputs to ground when the power is removed from the level shifter 202.

An aspect further includes a head switch (PMOS transistor 316) configured to remove the power from the level shifter 202 when the mask signal (mask signal, wbt_n) is active.

An aspect further includes a head switch controller (e.g., PMOS transistors 310, 312 and NMOS transistor 314) configured to control the head switch (PMOS transistor 316). The head switch controller (e.g., PMOS transistors 310, 312 and NMOS transistor 314) may be responsive to the level shifter output (e.g., L1/L2).

In an aspect, the bitline is coupled to the level shifter 202, e.g., an output of the level shifter 202.

In an aspect, the bitline is coupled to the level shifter 202, e.g., an output of the level shifter 202 through a multiplexer (read/write multiplexer).

Another example apparatus described herein is another memory 212. The memory 212 includes a plurality of memory cells 210. The memory 212 also includes a bitline coupled to the plurality of memory cells 210. Additionally, the memory 212 also includes a maskable level shifter 300 configured to receive write data (write data, DIN) and a mask signal (mask signal, wbt_n). The maskable level shifter 300 includes a level shifter 202 configured to level shift the write data (write data, DIN) and output the level shifted write data to the bitline when the mask signal (mask signal, wbt_n) is inactive (e.g., logic 1). The maskable level shifter 300 includes a masking circuit 206 configured to output a predetermined state to the bitline when the mask signal (mask signal, wbt_n) is active.

In an aspect, the level shifter 202 output includes complimentary outputs. The masking circuit 206 may be further configured to drive each of the complimentary outputs to the predetermined state when the power is removed from the level shifter.

In an aspect, the masking circuit 206 further includes a pulldown circuit 208 configured to drive the each of the complimentary outputs to ground when the power is removed from the level shifter 202.

An aspect further includes a head switch (PMOS transistor 316) configured to remove the power from the level shifter 202 when the mask signal (mask signal, wbt_n) is active.

An aspect further includes a head switch controller (e.g., PMOS transistors 310, 312 and NMOS transistor 314) configured to control the head switch (PMOS transistor 316). The head switch controller (e.g., PMOS transistors 310, 312 and NMOS transistor 314) may be responsive to the level shifter output (e.g., L1/L2).

In an aspect, the bitline is coupled to the level shifter 202, e.g., an output of the level shifter 202.

In an aspect, the bitline is coupled to the level shifter 202, e.g., an output of the level shifter 202 through a multiplexer (read/write multiplexer).

One aspect is a maskable level shifter circuit 200. The maskable level shifter circuit 200 may include a means for level shifting (202) having an output. The means for level shifting (202) may be being configured to receive a mask signal. The maskable level shifter circuit 200 may also include means for masking (206). The means for masking may be configured to remove power from the level shifter when the mask signal is active and pull the level shifter output to a predetermined state when the power is removed.

One example apparatus described herein is another memory. The memory may include means for storing data (210) and a bitline coupled to the means for storing data (210). The memory may include a maskable level shifter circuit 200. The maskable level shifter circuit 200 may include a means for level shifting (202) having an output. The means for level shifting (202) may be being configured to receive a mask signal. The maskable level shifter circuit 200 may also include means for masking (206). The means for masking may be configured to remove power from the level shifter when the mask signal is active.

One example apparatus described herein is another memory. The memory may include means for storing data (210) and a bitline coupled to the means for storing data (210). The memory may include a maskable level shifter circuit 200. The maskable level shifter circuit 200 may include a means for level shifting (202) having an output. The means for level shifting (202) may be being configured to receive a mask signal. The maskable level shifter circuit 200 may also include means for masking (206). The means for masking may be configured to remove power from the level shifter when the mask signal is active and pull the level shifter output to a predetermined state when the power is removed.

One example method described herein may include storing data in a memory having a bitline. The memory may include a maskable level shifter circuit 200. The method may also include level shifting and receiving a mask signal. The method may include masking and removing power from the level shifter when a mask signal is active.

One example method may include storing data in a memory having a bitline. The method may also include level shifting and receiving a mask signal. The method may include masking. The masking may include remove power from the level shifter when the mask signal is active and pull the level shifter output to a predetermined state when the power is removed.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A maskable level shifter circuit, comprising:
a level shifter having an output, the level shifter being configured to receive a mask signal; and
a masking circuit configured to remove power from the level shifter when the mask signal is active and drive the output to a predetermined state when the power is removed.

2. The maskable level shifter circuit of claim 1, wherein the output comprises complimentary outputs, and wherein the masking circuit is further configured to drive each of the complimentary outputs to the predetermined state when the power is removed from the level shifter.

3. The maskable level shifter circuit of claim 2, wherein the masking circuit further comprises a pulldown circuit configured to drive the each of the complimentary outputs to ground when the power is removed from the level shifter.

4. The maskable level shifter circuit of claim 1, further comprising a head switch configured to remove the power from the level shifter when the mask signal is active.

5. The maskable level shifter circuit of claim 4, further comprising a head switch controller configured to control the head switch, the head switch controller being responsive to the output.

6. A memory, comprising:
a plurality of memory cells;
a bitline coupled to the plurality of memory cells; and
a maskable level shifter configured to receive write data and a mask signal, wherein the maskable level shifter comprises:
a level shifter having an output, the level shifter configured to level shift the write data and output the level shifted write data to the bitline when the mask signal is inactive, and
a masking circuit configured to remove power from the level shifter when the mask signal is active.

7. The memory of claim 6, wherein the output comprises complimentary outputs, and wherein the masking circuit is further configured to drive each of the complimentary outputs to the predetermined state when the power is removed from the level shifter.

8. The memory of claim 7, wherein the masking circuit further comprises a pulldown circuit configured to drive the each of the complimentary outputs to ground when the power is removed from the level shifter.

9. The memory of claim 6, further comprising a head switch configured to remove the power from the level shifter when the mask signal is active.

10. The memory of claim 9, further comprising a head switch controller configured to control the head switch, the head switch controller being responsive to the output.

11. The memory of claim 6, wherein the bitline is coupled to the level shifter.

12. The memory of claim 11, wherein the bitline is coupled to the level shifter through a multiplexer.

13. A memory, comprising:
a plurality of memory cells;
a bitline coupled to the plurality of memory cells; and
a maskable level shifter configured to receive write data and a mask signal, wherein the maskable level shifter comprises:

a level shifter having an output, the level shifter configured to level shift the write data and output the level shifted write data to the bitline when the mask signal is inactive, and a masking circuit configured to output a predetermined state to the bitline when the mask signal is active.

14. The memory of claim 13, wherein the output comprises complimentary outputs, and wherein the masking circuit is further configured to drive each of the complimentary outputs to the predetermined state when the power is removed from the level shifter.

15. The memory of claim 14, wherein the masking circuit further comprises a pulldown circuit configured to drive the each of the complimentary outputs to ground when the power is removed from the level shifter.

16. The memory of claim 13, further comprising a head switch configured to remove the power from the level shifter when the mask signal is active.

17. The memory of claim 16, further comprising a head switch controller configured to control the head switch, the head switch controller being responsive to the output.

18. The memory of claim 13, wherein the bitline is coupled to the level shifter.

19. The memory of claim 18, wherein the bitline is coupled to the level shifter through a multiplexer.

20. A memory, comprising:

means for storing data;

a bitline coupled to the means for storing data; and means for maskable level shifting configured to receive write data and a mask signal, wherein the means for masking comprises:

means for level shifting configured to level shift the write data and output the level shifted write data to the bitline when the mask signal is inactive, and means for masking configured to remove power from the level shifter when the mask signal is active and output a predetermined state to the bitline when the mask signal is active.

21. The memory of claim 20, wherein the means for level shifting comprises complimentary outputs, and wherein the means for masking is further configured to drive each of the complimentary outputs to the predetermined state when the power is removed from the means for level shifting.

* * * * *